Figure 3:
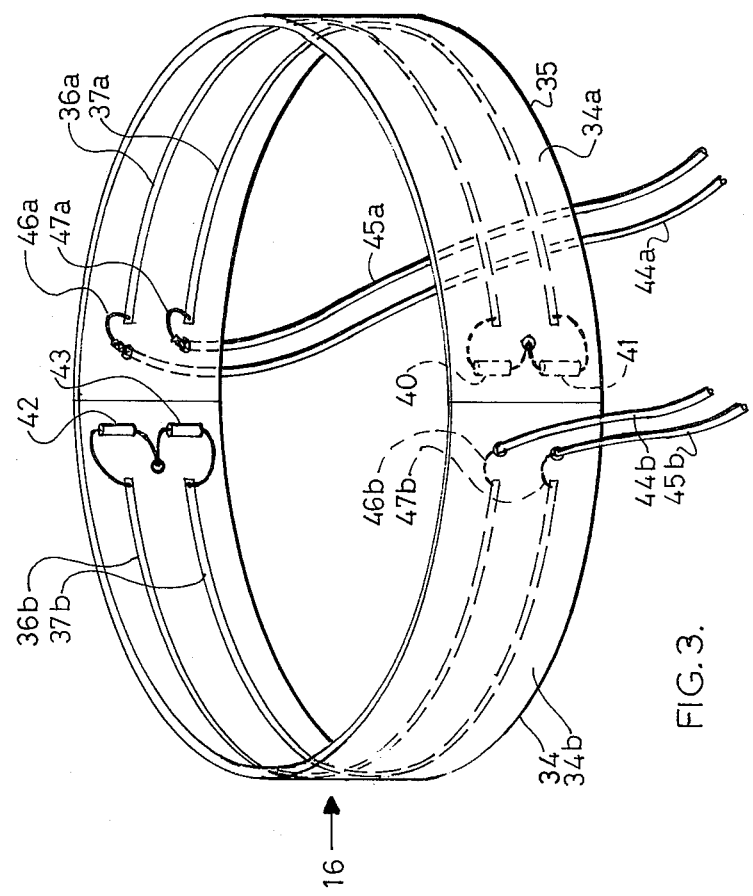

United States Patent [19]

Freeman

[11] 4,238,733

[45] Dec. 9, 1980

[54] CORONA DISCHARGE MONITOR SYSTEM

[75] Inventor: David L. Freeman, Bridgenorth, Canada

[73] Assignee: Canadian General Electric Company Limited, Toronto, Canada

[21] Appl. No.: 39,208

[22] Filed: May 15, 1979

[51] Int. Cl.³ ............................................ G01R 31/34
[52] U.S. Cl. .............................. 324/158 MG; 322/99; 324/52; 361/20
[58] Field of Search ............... 361/20, 21, 23; 324/52, 324/96, 158 MG; 340/635, 648; 322/99

[56] References Cited

U.S. PATENT DOCUMENTS

| | | | |
|---|---|---|---|
| 4,156,846 | 5/1979 | Harrold et al. | 324/158 MG |
| 4,164,705 | 8/1979 | Whitney et al. | 324/158 MG |

OTHER PUBLICATIONS

"Airborne Scanner Detects Transmission Line Problems", Transmission and Distribution, vol. 24, No. 4, 4/72 324/52.

Primary Examiner—Harry E. Moose, Jr.

Attorney, Agent, or Firm—R. A. Eckersley

[57] ABSTRACT

A corona discharge monitor system for a dynamoelectric machine, particularly for large salient pole generators, has an antenna mounted on a rotor pole. The antenna sweeps over the stator slots and picks up radio frequency signals produced by corona activity occurring in the structure of the stator bars. A rotary coupler, having a rotating portion fixed to the shaft of the machine and a fixed portion adjacent to the rotating portion, couples the signal to a signal conditioner. A trigger signal synchronized with the rotor rotation and with a known reference to antenna position and derived from the power system line frequency, is used as one input to a storage device such as a variable persistence oscilloscope. A first output of the signal conditioner represents the peak amplitude of the corona discharge and a second output represents the number of corona occurrences and these are applied to the storage device. A display is provided with reference to the trigger signal in such a way as to associate the first or second output with each slot, or if not a particular slot, at least within a limited number of slots.

13 Claims, 5 Drawing Figures

CORONA DISCHARGE MONITOR SYSTEM

This invention relates to a corona discharge monitor system for dynamoelectric machines.

In dynamoelectric machines, and particularly in larger salient pole dynamoelectric machines, the stator winding normally comprises one or more conductors or bars in slots surrounded by insulation, with an armour jacket which is often a partly conductive armour jacket overlying the insulation on the side walls of the bar. The term "partly conductive" or "partially conductive" is used only to indicate a conductive material having a resistance which permits current flow but is less conductive than the conductors used in a dynamoelectric machine. The bars are fitted into the respective slots in the stator core laminations and secured by wedging or other means. Initially the partially conductive armour covering on the bar or coil side makes good electrical contact with the edges of the laminations which define the slot in which it is located. Thus, the partially conductive armour will be at the same potential as the core. The bar vibration caused largely by the electromagnetic forces in an operating machine, coupled with thermal expansion and contraction, will in time reduce the integrity of the contact between the partially conductive armour jacket and the laminations. The laminations are not all identical and some project very slightly farther into the slot than others. This non-uniformity in the slot wall may tend to increase the tendency to lose contact resulting from bar movement due to vibration and thermal expansion and contraction. When the integrity of the contact is reduced between the partially conductive armour and the laminations, the capacitive current that is normally drained to ground through the partially conductive armour will not have a low resistance path through which to flow. As a result, voltage gradients sufficient to cause various types of corona and slot discharge may occur. The term "corona discharge" as used herein is intended to cover a range of discharge phenomena including a streamer type of irregular pulse discharge, a steadier glow type discharge, and a breakdown discharge or spark discharge which may be a complete slot discharge. The invention will, depending on background noise, detect lower levels of corona discharge however the invention is primarily aimed at the detection of the slot discharge or spark which is of higher energy and causes the greatest amount of damage to insulating materials. As higher operating voltages are used in dynamoelectric machines there is a greater tendency for corona discharge to occur. It is well know that in the presence of corona discharge (particularly a spark type discharge) an insulating material can be eroded and eventually break down.

It is known in dynamoelectric machines that provision of a resilient partly conductive material between the armour and the core greatly reduces the tendency for corona discharge to occur, but it does not eliminate it completely. There are many dynamoelectric machines which use a hard conductive paint. This appears to be inferior to the resilient conducting material, i.e. resilient partly conductive material for control of slot discharge.

It will be apparent that if the presence of corona discharge could be determined in an operating dynamoelectric machine, the machine could be shut down and a repair made before the problem developed into a serious fault. It will also be apparent that if the extent and exact location of the corona discharge could be determined, the repair could be effected much more efficiently and quickly.

A corona discharge appears to provide electrical excitation to the bar over a wide frequency spectrum. It appears, for example, to provide energy from perhaps 0.5 MHz to 100.0 MHz as well as some energy at other frequencies.

In the past use has been made of the lower frequencies, perhaps up to frequencies of the order of a few hundred kHz, to detect corona discharge in dynamoelectric machines. To determine corona discharge by this procedure, the machine is disconnected from the line and run at no load, full voltage configuration. Normally an oscilloscope is connected to each phase through an isolating capacitor and a filter and the voltage observed on an oscilloscope. With the line frequency and harmonics filtered out, a corona discharge will show up as small voltage pulses on the oscilloscope trace indicating to an experienced eye that there is corona activity on one or another phase of the machine winding. At lower frequencies, the signals from one phase can propagate through the entire winding via the neutral connection making it difficult to determine the exact location of the corona activity. When a high level of corona activity is found, the machine is then shut down and the bars in the phase which gives the largest corona signals are physically examined to locate the region of corona discharge.

Not only is it impossible, without physical inspection, to locate a particular slot or even a particular area where a corona discharge has occurred using the detection method just described, but there is considerable amount of interference combined with the signal making it difficult to separate the desired signal from the noise.

In the past attempts have been made to detect corona discharge using acoustic energy. A detector adjacent the dynamoelectric machine detects acoustic energy in the sonic or ultrasonic region. This has not been satisfactory and is impractical in an operating machine.

It is therefore a object of this invention to provide a method of determining at least a particular area involving only few slots where corona discharge events are occurring.

It is also a object of this invention to provide apparatus capable of determining at least a particular area, if not an exact slot, where corona discharge activity is occurring.

In a system according to the present invention, an antenna is mounted on a rotor pole to pick up radiated energy in a radio frequency band, for example energy at a particular radio frequency, and a coupling arrangement is used to transfer the radio frequency signal energy from the rotor to a signal conditioning unit. The signals are sampled synchronously with the passage of the antenna over each bar in a manner which allows location of a region of corona discharge (if not the exact slot where corona discharge occurs). Wedges have almost no influence on radiation at radio frequencies. The radiated energy from a bar occurs at well defined frequencies related to the length of the bar acting as a half wave radiating antenna and are easily picked up. These frequencies do not propagate into the rest of the winding but radiate principally from the front of the slot in which they occur. Consequently a good indication is obtained of the precise region of corona discharge. This procedure can be used while the machine is in service, and this is an important feature.

Accordingly there is provided a corona discharge monitor system for a dynamoelectric machine having a rotor and a stator, said stator having slots therein with insulated conductors in said slots, said system comprising antenna means mounted on said rotor for rotation with said rotor for receiving radio frequency signals resulting from corona discharge in said slots in succession, means for transferring said radio frequency signals received by said antenna means to a place externally of said dynamoelectric machine, means for detecting the rotational position of said rotor, and thereby the rotational position of said antenna means and for providing a positional signal representing the position, and utilization means for receiving said radio frequency signal from said means for transferring said radio frequency signal and for receiving said positional signal from said means for detecting the rotational position of said rotor and for synchronizing said signals to provide an indication of the occurrence of said radio frequency signals with reference to the rotational position of said antenna means.

Also according to the invention there is provided a method for locating corona discharge in a slot in the stator of a dynamoelectric machine, comprising running said dynamoelectric machine under load, receiving radio frequency signals occurring in said slots with antenna means on the face of the rotor of said dynamoelectric machine, transferring the received radio frequency signals to a place external of said dynamoelectric machine, detecting the rotational position of said rotor and providing a positional signal representing the position thereof, synchronizing the transferred radio frequency signals and the positional signal to provide an indication of the occurrence of radio frequency signals with reference to the rotational position of the rotor.

Figure 1:
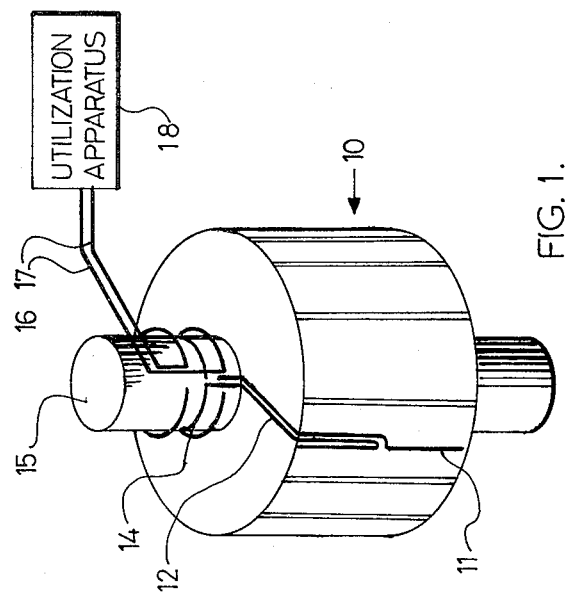
Figure 2:
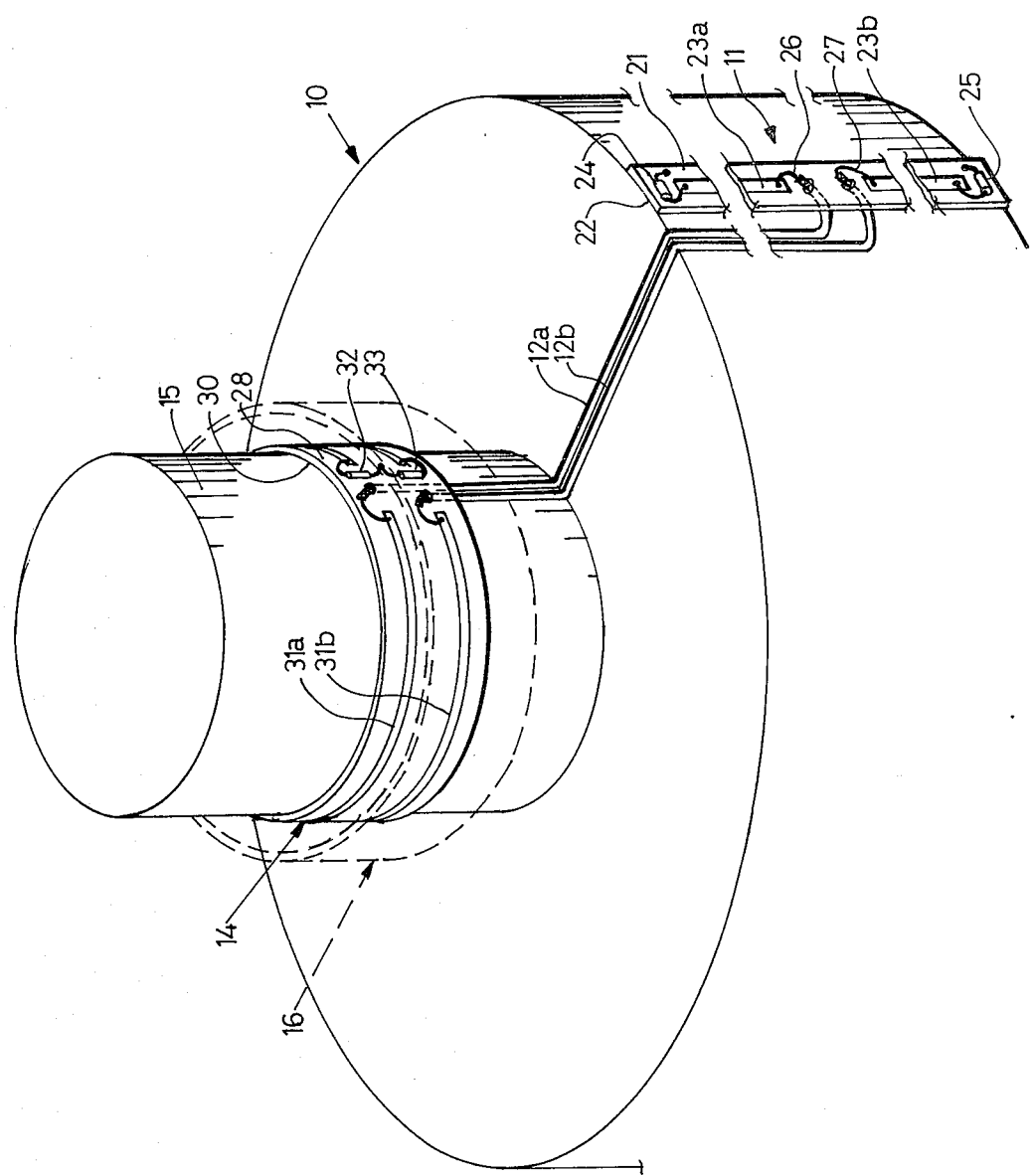
Figure 4:
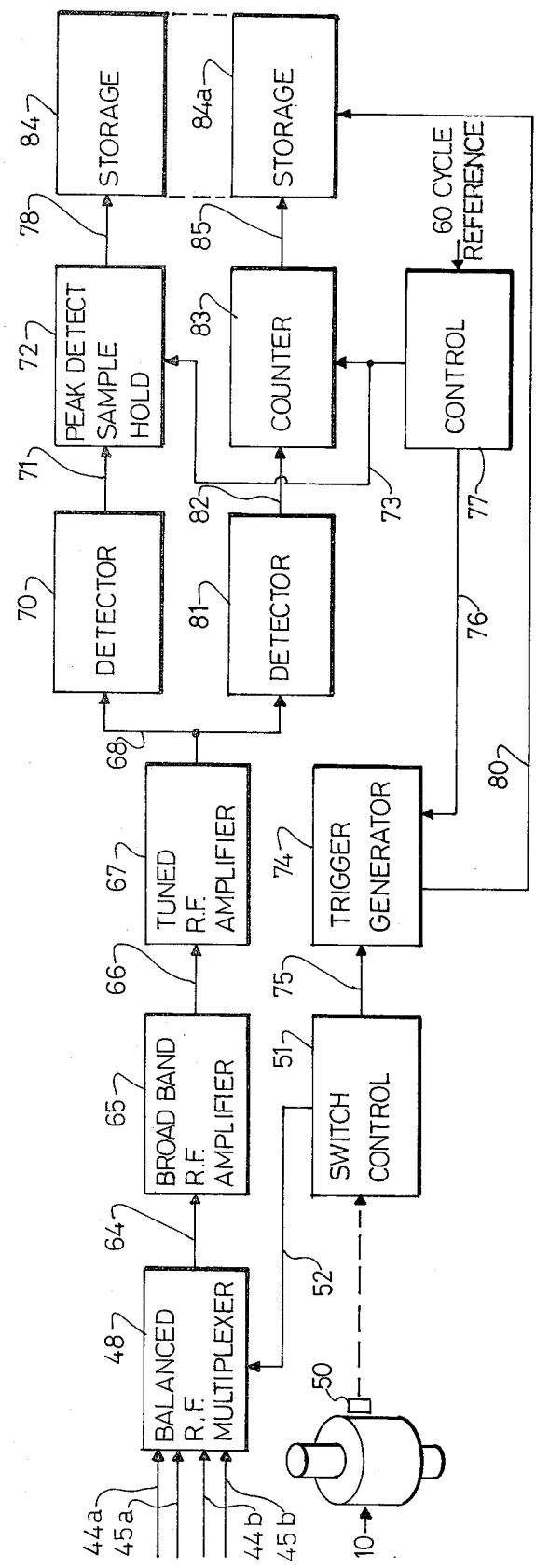
Figure 5:
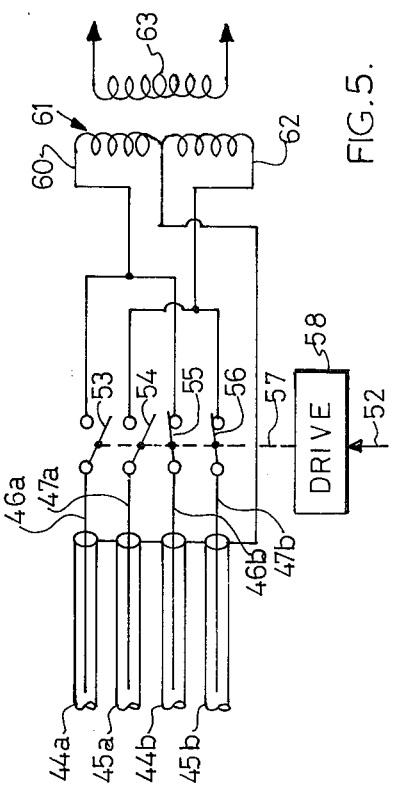

The invention will be described with reference to the accompanying drawings, in which:

FIG. 1 is a schematic isometric view of a rotor of a dynamoelectric machine with a simplified representation of an embodiment of the apparatus of the present invention, FIG. 2 is an isometric view showing detail of a particular antenna arrangement according to an embodiment of the invention, FIG. 3 is an isometric view of the outer coupler shown in broken lines in FIG. 2, FIG. 4 is a simplified block diagram of suitable signal conditioning circuitry for the present invention; and FIG. 5 is a schematic diagram showing in diagrammatic form a multiplexer suitable for the circuitry of FIG. 4.

Referring now to FIG. 1, a rotor 10 of a dynamoelectric machine is shown in simplified form. Rotor 10 rotates in a stator core (not shown) as is well known in the art. There are slots in the stator core which hold conductors or bars and it is in these slots that corona discharge may occur. In a stator winding each bar, depending on its place in a particular coil, will vary in its R.M.S. voltage with respect to the stator laminations. Consequently some bars may only reach low levels of voltage while others may reach voltages sufficient to result in all types of corona discharge. It is important to know the location of the slot in which any type of discharge occurs, and it is also desirable to know the severity of the discharge. To do this an antenna 11 is mounted on the surface of a rotor pole. Thus, the antenna 11 will sweep across each slot in the stator core once in each revolution. In a generator it is preferable to locate the antenna behind the centre line of the pole by the average torque angle for the particular machine. The voltage is maximum when the rate of flux change is maximum, or as one pole leaves a coil and the next pole approaches. This is true for no load conditions. In a generator under load the armature reaction causes the resultant flux to lag the pole flux by the torque angle so under load the poles move ahead of the voltage wave formed by the torque angle. Thus the antenna is preferably placed behind the centreline of the pole by the average torque angle.

A transmission line 12 connects antenna 11 to a rotating coupler 14 encircling the shaft 15 of rotor 10, or other coupling means. Spaced radially outwardly from and concentric with rotating coupler 14 is a fixed coupler 16. The fixed coupler 16 is connected by transmission line 17 to a utilization means or apparatus 18. The utilization apparatus 18 may include a radio frequency amplifier, a signal conditioner such as a filter or filters, and some storage and indicating or recording means. As will be explained in more detail hereinafter it will also in a preferred form include means for synchronously relating the radio frequency signals with a positional signal from the rotor to relate the indication to antenna position as a function of time.

Very briefly, as rotor 10 rotates on its shaft 15, the antenna 11 sweeps across the slots in the stator core. Any corona discharge taking place within a slot while the antenna is adjacent to it will produce a burst of high frequency energy and at least some of this energy will be radiated at radio frequencies. Antenna 11 will pick up this radio frequency energy and will provide a corresponding signal at rotating coupler 14. The rotating coupler 14 and fixed coupler 16 may be considered as a form of rotary transformer, and the signal on the rotating coupler 14 is thus coupled to the fixed coupler 16. Transmission line 17 conducts the signal to the utilization apparatus 18 where it may be passed through stages of filtering, amplification and detection. The signal will thus be a representation of radio frequency energy which is present as antenna 11 sweeps around the stator core. By synchronously relating the signal with rotor rotation, any indication of corona discharge in the signal can be readily associated with a particular slot or a small group of slots in the stator core.

Referring now to FIG. 2, there is shown a portion of a rotor 10, enlarged with respect to FIG. 1, with an antenna 11 and rotating coupler 14 shown in more detail. The antenna 11 in a preferred form is a balanced non-resonant antenna comprising a 50 ohm stripline structure having a base of dielectric material 21 with a ground plane in the form of a metallic coating 22 on the side adjacent to the rotor 10 and conductive strips 23a and 23b on the opposite side. The strip 23a is terminated at the outward end by a 50 ohm resistance 24 connected from the strip 23a to the ground plane 22. The strip 23b is terminated at its outward end by a 50 ohm resistance 25 connected from strip 23b to the ground plane 22. A coaxial cable 12a has its central conductor 26 connected to the inward end of strip 23a and its outer conductor connected to ground plane 22. Similarly a coaxial cable 12b has its central conductor 27 connected to the inward end of strip 23b and its outer conductor connected to the ground plane 22.

The rotating coupler 14 comprises a dielectric base 28 having a ground plane 30 on the side thereof adjacent the surface of shaft 15, and a pair of parallel 50 ohm striplines 31a and 31b which are on the radially outward side of dielectric base 28 and which extend around a major portion of shaft 15 as shown. The central conductor 26 of coaxial line 12a is connected to one end of stripline 31a, and the central conductor 27 of coaxial line 12b is connected to one end of stripline 31b. The outer conductor of both coaxial lines 12a and 12b is connected to ground plane 30. The end of each stripline 31a and 31b, remote from the ends to which the coaxial cables 12a and 12b are connected, are connected to ground plane 30 by 50 ohm resistors 32 and 33 respectively. Spaced radially outwards from rotating coupler 14 is fixed coupler 16 which is shown in broken line in FIG. 2 in order to indicate its position. Fixed coupler 16 is shown in more detail in FIG. 3. The spacing between the rotating coupler 14 and the fixed coupler 16 is not critical but should be kept as small as possible to improve coupling in keeping with the mechanical considerations.

Referring now to FIG. 3, the fixed coupler 16 is shown having a flat, circular dielectric base 34 made in two halves 34a and 34b for ease of assembly around the shaft of the machine. There is a ground plane or ground coating 35 on the outer surface of dielectric base 34. On the inner surface of each half 34a and 34b are two 50 ohm striplines. The striplines on the half 34a of base 34 are designated 36a and 37a. The striplines on the half 34b of base 34 are designated 36b and 37b. The striplines 36a and 37a are terminated by 50 ohm resistors 40 and 41 respectively. The striplines 36b and 37b are terminated by 50 ohm resistors 42 and 43 respectively. There is a 50 ohm coaxial cable connected to the other end of each of the striplines. That is, a coaxial cable 44a and 45a is connected respectively to the other end of stripline 36a and 37a, and a coaxial cable 44b and 45b is connected respectively to the other end of stripline 36b and 37b. In other words, the shielding or outer conductor of each coaxial cable 44a, 44b, 45a and 45b is connected to ground plane 35, and the inner conductor 46a, 46b, 47a and 47b respectively is connected to the end of stripline 36a, 36b, 37a and 37b respectively.

The stripline coupler just described may be referred to as a cylindrical balanced contra-directional stripline coupler.

The antenna of FIG. 2 comprising ground plane 22 and striplines 23a and 23b, and the rotating and fixed coupler of FIGS. 2 and 3 comprising respectively ground plane 30, striplines 31a and 31b and ground plane 35 and striplines 36a, 36b, 37a and 37b, are all referred to as 50 ohm striplines with appropriate termination. It should be emphasized that striplines of other impedance values, with suitable termination, could be used, and also the antenna and rotating and fixed couplers need not be in the form of stripline. While stripline is suitable and is preferred because of its balanced arrangement and ease of construction in this embodiment, it is not essential to the operation of the invention.

Also, it is sometimes convenient for both rotating coupler 14 and fixed coupler 16 to use air as a dielectric, that is to use solid dielectric supports at intervals around the coupler to provide a constant air gap space from the ground plane, thus providing air dielectric.

The length of the stripline portions in the coupler will determine the frequency at which maximum coupling occurs. It has been found in practice that the length of the shorter portion of the coupler whether fixed or rotating appears to have greater effect on determining the frequency at which maximum coupling occurs. The length is preferably made as one quarter the wavelength of the desired coupling frequency, although other design factors as are known in the art are used to keep the coupling as broad as possible. The diameter of the coupler can be increased above the shaft diameter if this is necessary to lower the coupling frequency.

Referring now to FIG. 4, two balanced coaxial cable pairs 44a, 45a and 44b 45b are connected to a balanced radio frequency multiplexer 48. A rotation detector 50 provides a signal representing each complete rotation of rotor 10, or a multiple thereof, to a switch control 51. It may be preferable to use two detectors 50, one on each side of the rotor, in combination with a triggered multivibrator or flip-flop which will give a convenient indication of which half of the fixed coupler is in a desired position as will be explained more fully hereinafter. When switch control 51 receives a signal representing rotor rotation it provides a signal over conductor 52 to multiplexer 48 to control the multiplexer to switch back and forth during each half cycle of rotation of rotor 10. It will be recalled that on the rotating coupler 14, the striplines 31a and 31b extend around a major portion of the shaft 15, but that there is a gap between the terminating ends of the stripline 31a and 31b and the ends coupled to the coaxial cable 12a and 12b (see FIG. 2). If the fixed coupler were constructed in a similar configuration the signal coupled from one to the other would at certain frequencies cancel out due to a 180° phase shift down the stripline. That is, if the stripline in the fixed coupler is distributed over both ends of the rotating coupler a loss of signal would occur at that location once each revolution of the rotor because of the difference in phase of the signal at each end of the rotating coupler. To avoid this the fixed coupler 16 is made with two sets of stripline antenna. The multiplexer 48, driven by the signal from switch control 51, switches to receive the signals from cables 44a and 45a when the gap in the stripline on the rotating coupler is not opposite stripline 36a and 37a, and switches to receive signals from cables 44b and 45b when the gap on the stripline on the rotating coupler is not opposite stripline 36b and 37b. Thus the signal coupled from the rotating coupler 14 to the fixed coupler 16 is always from the coupler half which is not over the gap in the rotating coupler. A simple arrangement for carrying this out is shown schematically in FIG. 5.

Referring for the moment to FIG. 5, there is shown in simplified schematic form, a circuit which could be incorporated into block 48 (FIG. 4) representing the balanced radio frequency multiplexer to provide the necessary switching from one set of stripline couplers to the other set. The centre conductors 46a, 47a, 46b and 47b of coaxial cables 44a, 45a, 44b and 45b respectively, are connected to a pair of double pole, double throw radio frequency switches. That is, conductor 46a and 47a are connected to switch members 53 and 54 respectively, and conductors 46b and 47b are connected to switch members 55 and 56 respectively. Switch members 53, 54, 55 and 56 are actuated simultaneously by arm 57 operated by a drive 58. As shown in FIG. 5, switch members 55 and 56 are in a closed position where conductor 46b is connected to end 60 of a shielded balun transformer 61, and conductor 47b is connected to end 62 of transformer 61. As shown in FIG. 5, switch members 53 and 54 are in the open position. Thus, as shown in FIG. 5, striplines 36a and 37a are coupled to one side of transformer 61. When a signal from switch control 51 is received over conductor 52 to cause switching, then drive 58 operates arm 57 to move switch members 53 and 54 to the closed position and switch members 55 and 56 to the open position. This will couple striplines 36b and 37b to the respective sides of balun transformer 61. The winding 63 of transformer 61 will thus have signals received from alternate sides of fixed coupler 16. The switching action takes place twice each shaft revolution as was previously explained to obtain a signal unaffected by the gap in striplines 31a and 31b (FIG. 2) as the striplines rotate on shaft 15. While FIG. 5 shows a mechanical switch arrangement for simplicity of description, it will be apparent that solid state radio frequency switches are preferred.

Referring again to FIG. 4, the output from balanced multiplexer 48 is applied over conductor 64 to a broad band radio frequency (RF) amplifier 65 which provides initial amplification. The output from amplifier 65 is applied over conductor 66 to a tuned radio frequency (RF) amplifier 67. Although the coupler tends to have a resonant frequency, its response is relatively broad. There are frequencies which are emphasized by resonance as a result of the particular physical construction of the installation, such as bar length. The tuned RF amplifier permits selection of a specific frequency which is most significant. It has been found that significant frequencies are generally in the range of 25 MHz to 100 MHz, depending largely on bar length. Frequencies in this range have not been used before to detect and localize corona discharge in a dynamoelectric machine. Frequencies in this range do not propagate to any extent to the remainder of the winding and radiate principally from the slot in which the discharge occurs. It is this phenomena which allows location of the slot discharge.

There appears to be two factors of interest in the signal on conductor 68 which represents the corona discharge as the slots in the stator are scanned sequentially. These factors are (1) the maximum amplitude of discharge for each slot, and (2) the number of discharges which take place as the antenns is scanning each slot. Each factor may have a significance and it is preferable to determine a value for each.

The signal on conductor 68 is applied as an input to envelope detector 70, which provides an output signal on conductor 71 representing the envelope of the radio frequency burst for each slot discharge occurrence. The conductor 71 provides one input to peak detect sample and hold circuit 72. Conductor 73 provides a control input to peak detect sample and hold circuit 72. A trigger pulse generator 74 receives a signal on conductor 75 representing the rotation of the rotor, and a reference timing signal on conductor 76 from control 77. Control 77 provides a pulse waveform comprising a series of pulses on conductor 73 representing the number of stator slots per second, scanned by the antenna. Each pulse generated by trigger pulse generator 74 on line 80 is synchronous with the pulses on line 73 from control unit 77. However, the trigger pulse generator 74 produces only one pulse per revolution either coincident with a reference slot or delayed with respect to the reference slot by a specific number of slots. The peak detect sample and hold circuit 72 samples the signal on conductor 71 as the antenna passes each slot and holds the peak value until the antenna is adjacent the next slot. The sampling process is repeated as the antenna passes each slot. Thus, the output of circuit 72 on conductor 78 represents the peak discharge amplitude for each slot during the time the antenna is adjacent the slot. The output signal on conductor 78 goes to a storage apparatus or means 84. The storage means 84 provides storage for a longer term than circuit 72 and may be a memory device. Preferably the storage means 84 stores signals from conductor 78 and averages them over a number of revolutions of the rotor. The storage means 84 is synchronized with respect to rotor rotation by a signal from conductor 80. The storage means 84 may include means to digitize the signal from conductor 78 for a computer printout to show discharge amplitude with reference to rotor rotation. Storage means 84 may include some form of display. For example, it may include a plotter which provides a plot of corona discharge with reference to rotor rotation. In a preferred form, storage means 84 may be a variable persistance oscilloscope which provides a display of amplitude or degree of corona discharge for each slot whereby an average amplitude is indicated for a number of rotor revolutions.

A detector 81 also receives the signal on conductor 68. The detector has a short time constant and provides a pulse for each burst of radio frequency energy on conductor 68, and provides an output pulse on conductor 82 for each such burst. Conductor 82 is connected to a counter 83 which counts the pulses for each slot. Counter 83 also receives a signal via conductor 73 which latches the digital output and resets the counter as the scanning antenna passes to the next slot. When the counter 83 is latched it provides an analog voltage proportional to the count for that slot on conductor 85. Conductor 85 is connected to a storage apparatus or means 84a which may be as before a plotter or a variable persistance oscilloscope, properly synchronized by the signal on conductor 80, to provide a plot or display representing the number of discharges for each slot.

A suitable storage apparatus 84, 84a for this particular implementation is a dual beam, variable persistance oscilloscope with external triggering. The dual display will show simultaneously the maximum amplitude of discharge for each slot and the number of discharges for each slot. Thus conductors 78 and 85 would provide the two display or vertical inputs and conductor 80 would provide the necessary trigger for the sweep.

It will be seen that the present invention provides not only for detection of corona discharge under operating conditions but provides for determining a particular slot (or group of a few slots) as the location of the associated discharge.

What I claim as new and desire to secure by Letters Patent of the United States is:

1. A corona discharge monitor system for a dynamoelectric machine having a rotor and a stator, said stator having slots therein with insulated conductors in said slots, said system comprising antenna means mounted on said rotor for rotation with said rotor for receiving radio frequency signals resulting from corona discharge in said slots as said antenna means moves past said slots in succession, means for transferring said radio frequency signals received by said antenna means to a place externally of said dynamoelectric machine, means for detecting the rotational position of said rotor and thereby the rotational position of said antenna means and for providing a positional signal representing the position, and utilization means for receiving said radio frequency signal from said means for transferring said radio frequency signal and for receiving said positional signal from said means for detecting the rotational position of said rotor and for synchronizing said signals to provide an indication of the occurrence of said radio frequency signals with reference to the rotational position of said antenna means.

2. A corona discharge monitor system as defined in claim 1 in which said means for transferring said radio frequency signals received by said antenna means to a place externally of said dynamoelectric machine is a rotary coupler means having a rotating part on said rotor and a stationary part adjacent and coupled to said rotating part, said stationary part being connected to said utilization means.

3. A corona discharge monitor system as defined in claim 1, in which said means for transferring said radio frequency signals received by said antenna means to a place externally of said dynamoelectric machine comprises a rotating coupler mounted on the shaft of said rotor and a fixed coupler, said rotating coupler comprising first a stripline extending substantially all the way around said shaft with said antenna means connected to one end thereof and a terminating impedance connected to the other end thereof, said fixed coupler comprising a second stripline adjacent and spaced radially from said first stripline and coupled thereto with a terminating impedance connected to one end and a conducting means connected to the other end thereof and to said utilization means to conduct said radio frequency signals thereto.

4. A corona discharge monitor system as defined in claim 1 in which said antenna means comprises a stripline antenna having first and second similar striplines in end to end alignment with adjacent ends spaced apart, the remote ends each being terminated by a terminating impedance connected between each said remote end and a ground plane for said stripline antenna, in which said means for transferring said radio frequency signals received by said antenna means comprises a rotating coupler having third and fourth similar striplines, parallel to one another, spaced apart in an axial direction and extending around the shaft of said rotor, there being a gap between the first and second ends of said third stripline and a gap between the first and second ends of said fourth stripline, first and second coaxial cables each having a centre conductor and a shielding conductor, the centre conductor of said first coaxial cable being connected at a first end to the end of said first stripline opposite said remote end and being connected at a second end to said first end of said third stripline, the centre conductor of said second coaxial cable being connected at a first end to the end of said second stripline opposite said remote end and being connected at a second end to said first end of said fourth stripline, the shielding conductor of said first and second coaxial cables being connected at said first end thereof to said ground plane for said stripline antenna and being connected at said second end thereof to a ground plane for said third and fourth striplines, the second ends of said third and fourth striplines each being terminated by a terminating impedance connected between each said second end and a ground plane for said rotating coupler, and a fixed coupler having fifth, sixth, seventh and eighth striplines, said fifth and sixth striplines being opposite and spaced radially from said third and fourth striplines respectively and extending slightly less than half way around said shaft, said seventh and eighth striplines being opposite and spaced radially from said third and fourth striplines respectively and extending slightly less than half way around said shaft, said fifth and seventh and said sixth and eighth striplines being in spaced apart end to end relationship extending around said shaft, third, fourth, fifth and sixth coaxial cables, each having a centre conductor and a shielding conductor, the centre conductors of said third and fourth coaxial cables being connected at a first end thereof respectively to first ends of said fifth and sixth striplines and the shielding conductors of said third and fourth coaxial cables being connected at said first ends thereof to a ground plane for said fixed coupler, the centre conductors of said fifth and sixth coaxial cables being connected at a first end thereof respectively to first ends of said seventh and eighth striplines and the shielding conductors of said fifth and sixth coaxial cables being connected at said first ends thereof to said ground plane for said fixed coupler, the second ends of said fifth, sixth, seventh and eighth striplines each being terminated by a terminating impedance connected between each said second end and said ground plane for said fixed coupler, and in which said utilization means includes a radio frequency multiplexer switch responsive to shaft rotation to switch between said third and fourth coaxial cables and said fifth and sixth coaxial cables whereby radio frequency signals are provided to said utilization means coupled from said third and fourth striplines to said fifth and sixth striplines when said gap between the ends of said third and fourth striplines is opposite said seventh and eighth striplines and coupled from said third and fourth striplines to said seventh and eighth striplines when said gap between the ends of said third and fourth striplines is opposite said fifth and sixth striplines.

5. A corona discharge monitor system as defined in claim 1 in which said means for detecting the rotational position of said rotor includes control means responsive to a reference signal to generate a pulse waveform having pulses corresponding to the number of said slots in said stator, there being a pulse as said antenna means passes each said slot, said positional signal including said pulse waveform.

6. A corona discharge monitor as defined in claim 5 in which said utilization means comprises storage means which is responsive to said pulse waveform in said positional signal to provide a record of the peak amplitude of said radio frequency signal with reference to each slot.

7. A corona discharge monitor system as defined in claim 5 in which said utilization means comprises a counter resonsive to said pulse waveform to count the number of pulses of radio frequency signal occurring as said antenna means is adjacent each slot and to provide a count for each said slot, and storage means which is responsive to said pulse waveform in said positional signal to provide a record of the count for each slot with reference to each said slot.

8. A corona discharge monitor system as defined in claim 6 in which said storage means comprises a plotter, said record being in the form of a plot.

9. A corona discharge monitor system as defined in claim 6 in which said storage means comprises a variable persistance oscilloscope.

10. A corona discharge monitor system for a dynamoelectric machine having a rotor with poles and a stator, said stator comprising a laminated stator core having slots therein, and insulated conductor bars in said slots, said system comprising first means mounted on a pole of said rotor for receiving radio frequency signals occurring in said slots as said first means moves past each said slot with rotation of said rotor, second means for transferring radio frequency signals received by said first means to a place external of said dynamoelectric machine, third means for detecting the position of said first means and providing a positional signal representing said position, and fourth means at said place external of said dynamoelectric machine for receiving the transferred signal and said positional signal and providing an indication of said transferred signal with reference to the position of said first means.

11. A corona discharge system as defined in claim 10 in which said dynamoelectric machine is a salient pole generator and in which said first means comprises a balanced antenna and said second means comprises a balanced contradirectional stripline coupler.

12. A method for locating corona discharge in a slot in the stator of a dynamoelectric machine, comprising running said dynamoelectric machine under load, receiving radio frequency signals occurring in said slots with antenna means on the face of the rotor of said dynamoelectric machine, transferring the received radio frequency signals to a place external of said dynamoelectric machine, detecting the rotational position of said rotor and providing a positional signal representing the position thereof, synchronizing the transferred radio frequency signals and the positional signal to provide an indication of the occurrence of radio frequency signals with reference to the rotational position of the rotor.

13. A method as defined in claim 12 and further comprising generating a waveform having a number of pulses per unit of time the same as the number of slots per unit of time in the dynamoelectric machine, and controlling the waveform whereby the step of synchronizing the transferred radio frequency signal and the positional signal will provide an indication of the occurrence of radio frequency signals with reference to each slot.

* * * * *